(12) United States Patent
Hirose et al.

(10) Patent No.: US 11,381,213 B2
(45) Date of Patent: Jul. 5, 2022

(54) NOISE FILTER AND ELECTRICAL AND ELECTRONIC EQUIPMENT

(71) Applicant: MITSUBISHI ELECTRIC CORPORATION, Tokyo (JP)

(72) Inventors: Kenji Hirose, Tokyo (JP); Satoshi Yoneda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 80 days.

(21) Appl. No.: 17/039,782

(22) Filed: Sep. 30, 2020

(65) Prior Publication Data

US 2021/0021252 A1 Jan. 21, 2021

Related U.S. Application Data

(63) Continuation of application No. PCT/JP2018/020994, filed on May 31, 2018.

(51) Int. Cl.
| | | |
|---|---|---|
| H03H 7/01 | (2006.01) | |
| H03H 7/09 | (2006.01) | |
| H05K 1/02 | (2006.01) | |
| H05K 1/16 | (2006.01) | |
| H01F 27/24 | (2006.01) | |

(52) U.S. Cl.
CPC ............ *H03H 7/0115* (2013.01); *H03H 7/09* (2013.01); *H05K 1/0233* (2013.01); *H05K 1/165* (2013.01); *H01F 27/24* (2013.01)

(58) Field of Classification Search
CPC ............... H03H 7/0115; H03H 1/0007; H03H 2001/0085; H03H 7/09
USPC .......................................... 333/175, 181, 185
See application file for complete search history.

(56) References Cited

U.S. PATENT DOCUMENTS 6,476,689 B1    11/2002   Uchida et al.

FOREIGN PATENT DOCUMENTS

| JP | 62-5619 U | 1/1987 |
|---|---|---|
| JP | 10-13180 A | 1/1998 |
| JP | 2001-160728 A | 6/2001 |
| JP | 2016-31965 A | 3/2016 |

OTHER PUBLICATIONS

International Search Report for PCT/JP2018/020994 dated Jul. 3, 2018.
JP Office Action for JP Patent Application No. 2020-522508 dated Aug. 25, 2020.
Japanese Office Action for Japanese Application No. 2020-522508, dated Jan. 5, 2021, with English translation.

*Primary Examiner* — Rakesh B Patel
(74) *Attorney, Agent, or Firm* — Birch, Stewart, Kolasch & Birch, LLP (57) ABSTRACT

A noise filter includes a magnetic core including a magnetic material; and a distance adjusting member that accepts adjustment of a distance between a loop portion and the magnetic core, the loop portion being a portion of one or more conductor wiring lines wired in loop shape out of a first conductor wiring line and a second conductor wiring line.

6 Claims, 9 Drawing Sheets

NOISE FILTER AND ELECTRICAL AND ELECTRONIC EQUIPMENT

CROSS-REFERENCE TO RELATED APPLICATIONS

This application is a Continuation of PCT International Application No. PCT/JP2018/020994, filed on May 31, 2018, which is hereby expressly incorporated by reference into the present application.

TECHNICAL FIELD

The invention relates to a noise filter including conductor wiring lines wired in loop shape, and electrical and electronic equipment including the noise filter.

BACKGROUND ART

Electrical and electronic equipment may include a noise filter that suppresses propagation of electromagnetic noise generated from a first circuit mounted on a printed circuit board to a second circuit mounted on the printed circuit board.

In electrical and electronic equipment including a power supply pattern that connects a first circuit to a second circuit and a ground pattern that connects the first circuit to the second circuit, as a noise filter, a configuration in which a capacitor is connected between the power supply pattern and the ground pattern is known.

The capacitor bypasses electromagnetic noise that propagates through the power supply pattern to the ground pattern, and thereby prevents electromagnetic noise generated from the first circuit from propagating through the second circuit via the power supply pattern.

However, the capacitor includes an inductance component. In addition, each of a lead that connects the capacitor to the power supply pattern and a lead that connects the capacitor to the ground pattern also includes an inductance component.

The inductance components included in the capacitor, etc., reduce bypass performance for high-frequency components included in electromagnetic noise, and thus, propagation of high-frequency components of electromagnetic noise may not be able to be suppressed.

The following Patent Literature 1 discloses a noise filter that can suppress propagation of high-frequency components of electromagnetic noise.

The noise filter disclosed in Patent Literature 1 includes the following components (1) to (3):

(1) A loop-like conductor wiring line connected at its one end to a second circuit The loop-like conductor wiring line corresponds to a first reactor wired on a first conductor layer of a printed circuit board.

(2) A loop-like conductor wiring line connected at its one end to a first circuit and connected at its other end to the other end of the first reactor The loop-like conductor wiring line corresponds to a second reactor wired on a second conductor layer of the printed circuit board.

(3) A capacitor connected at its one end to the other end of the first reactor and connected at its other end to a ground layer which is a third conductor layer of the printed circuit board The first reactor and the second reactor are coaxially arranged and share magnetic flux generated by a current outputted from the first circuit, and thus, the first reactor and the second reactor are coupled to each other by a magnetic field with a mutual inductance M.

The mutual inductance M acts to reduce the inductance components included in the capacitor, etc., and thus, the effect of suppressing high-frequency components of electromagnetic noise improves.

CITATION LIST

Patent Literature

Patent Literature 1: JP 2016-031965 A

SUMMARY OF INVENTION

Technical Problem

In the noise filter disclosed in Patent Literature 1, since the inductance components included in the capacitor, etc., are reduced by the first reactor and the second reactor, the effect of suppressing high-frequency components of electromagnetic noise can be increased.

For the first reactor and the second reactor, reactors having an inductance that can cancel out the inductance components included in the capacitor, etc., are selected upon designing a printed circuit board.

However, due to the influence of dimensional tolerances, variation, or the like, upon manufacturing a board, the inductance components included in the capacitor, etc., may not be able to be cancelled out by the selected first reactor and second reactor.

When the inductance components included in the capacitor, etc., cannot be cancelled out by the selected first reactor and second reactor, there is a problem that re-designing and re-manufacturing of a printed circuit board may be required.

The invention is made to solve a problem such as that described above, and an object of the invention is to obtain a noise filter and electrical and electronic equipment that can increase the effect of suppressing high-frequency components of electromagnetic noise without performing re-designing and re-manufacturing of a printed circuit board.

Solution to Problem

A noise filter according to the invention includes: a ground line connected between a first circuit mounted on a first conductor layer of a board and a second circuit mounted on the first conductor layer; a capacitor having a first end connected to the ground line; a first conductor wiring line connected between a second end of the capacitor and the second circuit and wired in loop shape on the first conductor layer; a second conductor wiring line connected between the first circuit and the second end of the capacitor and wired in loop shape on a second conductor layer of the board, the second conductor wiring line being coupled to the first conductor wiring line by a magnetic field; a magnetic core including a magnetic material; and a distance adjusting member to accept adjustment of a distance between at least one of loop portions and the magnetic core, the loop portions being wiring portions in loop shape of the respective first and second conductor wiring lines, wherein the distance adjusting member accepts movement of the magnetic core in a horizontal direction of the first conductor layer or a horizontal direction of the second conductor layer.

Advantageous Effects of Invention

According to the invention, a noise filter is configured to include: a magnetic core including a magnetic material; and a distance adjusting member that accepts adjustment of a distance between at least one of loop portions and the magnetic core, the loop portions being wiring portions in loop shape of a respective first and a second conductor wiring lines, wherein the distance adjusting member accepts movement of the magnetic core in a horizontal direction of the first conductor layer or a horizontal direction of the second conductor layer. Therefore, the noise filter according to the invention can increase the effect of suppressing high-frequency components of electromagnetic noise without performing re-designing and re-manufacturing of a board.

BRIEF DESCRIPTION OF DRAWINGS

FIG. 4 is a cross-sectional view showing an A-A' cross section of FIGS. 2 and 3, with a magnetic core 11 being away from a loop portion 6a of the first conductor layer 1a.

FIG. 5 is a cross-sectional view showing the A-A' cross section of FIGS. 2 and 3, with the magnetic core 11 being close to the loop portion 6a of the first conductor layer 1a.

FIG. 17 is a cross-sectional view in a state in which a magnetic core 51 of electrical and electronic equipment according to a fourth embodiment is away from the loop portion 6a of the first conductor layer 1a.

FIG. 18 is a cross-sectional view in a state in which the magnetic core 51 of the electrical and electronic equipment according to the fourth embodiment is close to the loop portion 6a of the first conductor layer 1a.

DESCRIPTION OF EMBODIMENTS

To describe the invention in more detail, modes for carrying out the invention will be described below by referring to the accompanying drawings.

First Embodiment

Figure 1:
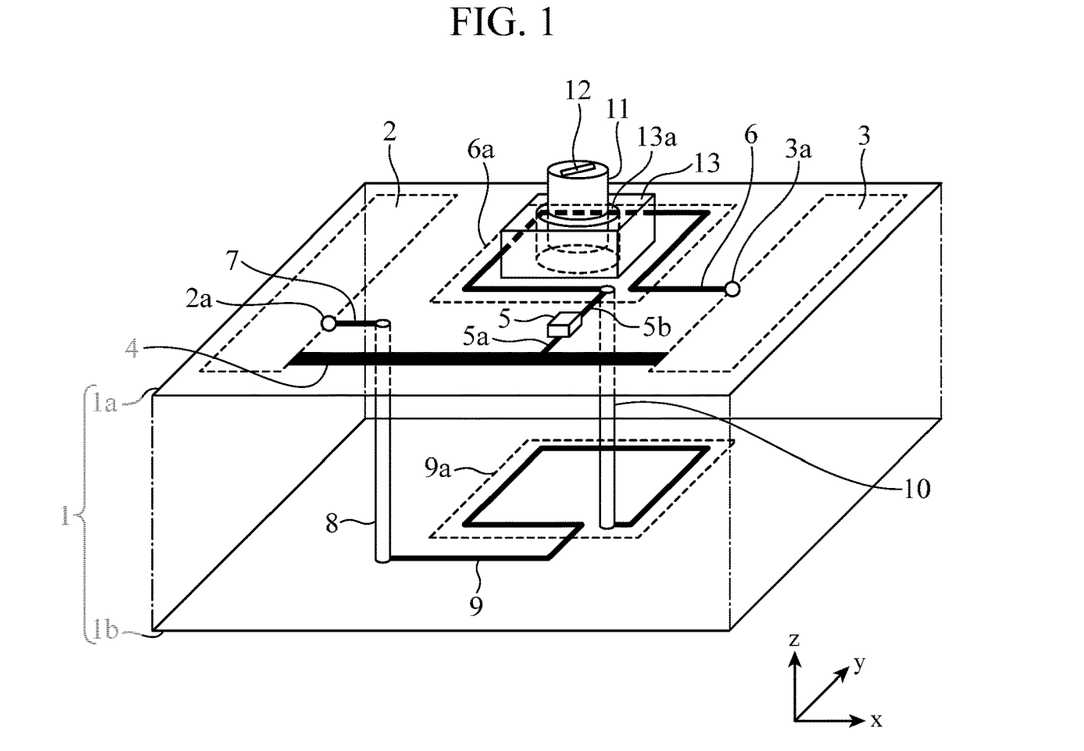
FIG. 1 is a perspective view showing electrical and electronic equipment including a noise filter according to a first embodiment.

FIG. 1 is a perspective view showing electrical and electronic equipment including a noise filter according to a first embodiment.

Figure 2:
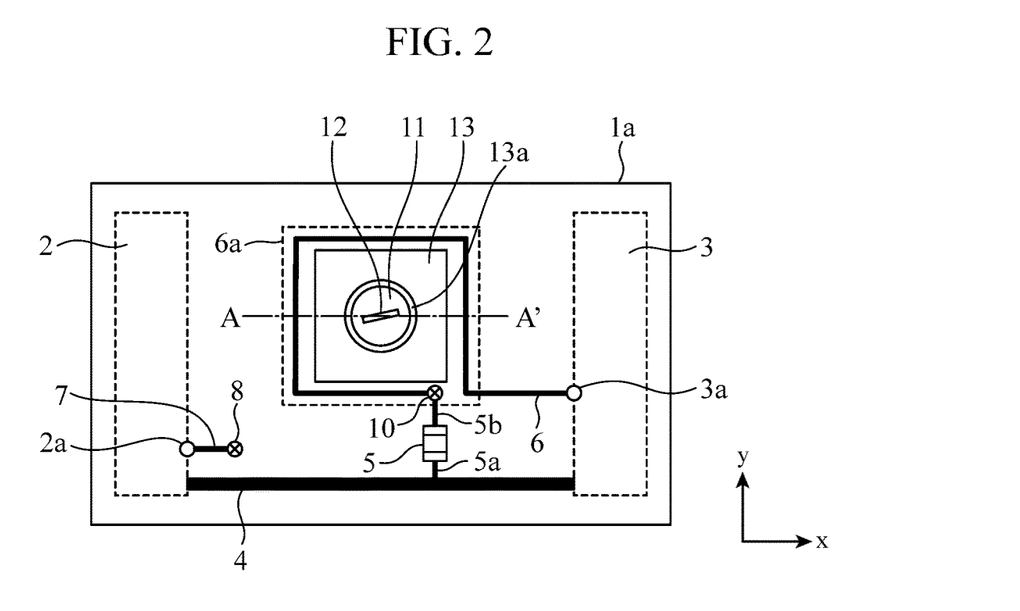
FIG. 2 is a plan view showing a first conductor layer 1a in a printed circuit board 1 of the electrical and electronic equipment shown in FIG. 1.

FIG. 2 is a plan view showing a first conductor layer 1a in a printed circuit board 1 of the electrical and electronic equipment shown in FIG. 1.

Figure 3:
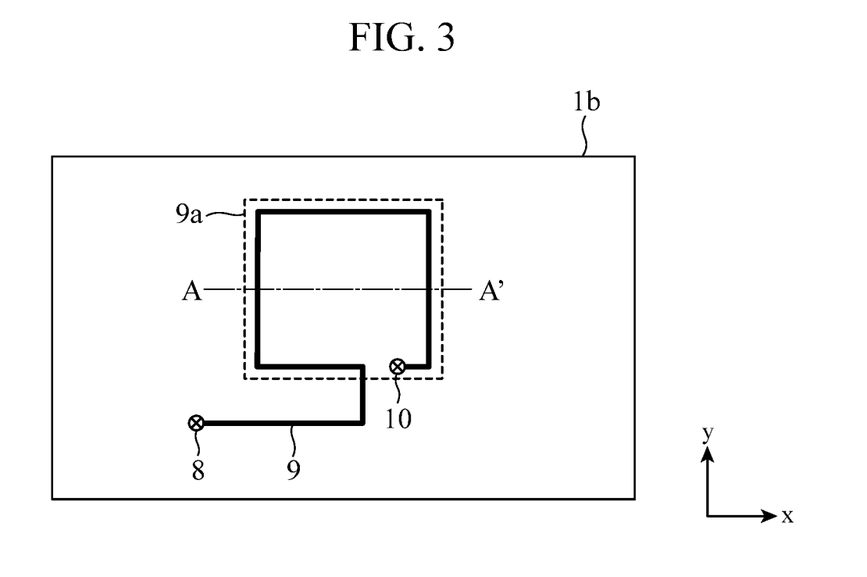
FIG. 3 is a plan view showing a second conductor layer 1b in the printed circuit board 1 of the electrical and electronic equipment shown in FIG. 1.

FIG. 3 is a plan view showing a second conductor layer 1b in the printed circuit board 1 of the electrical and electronic equipment shown in FIG. 1.

Figure 4:
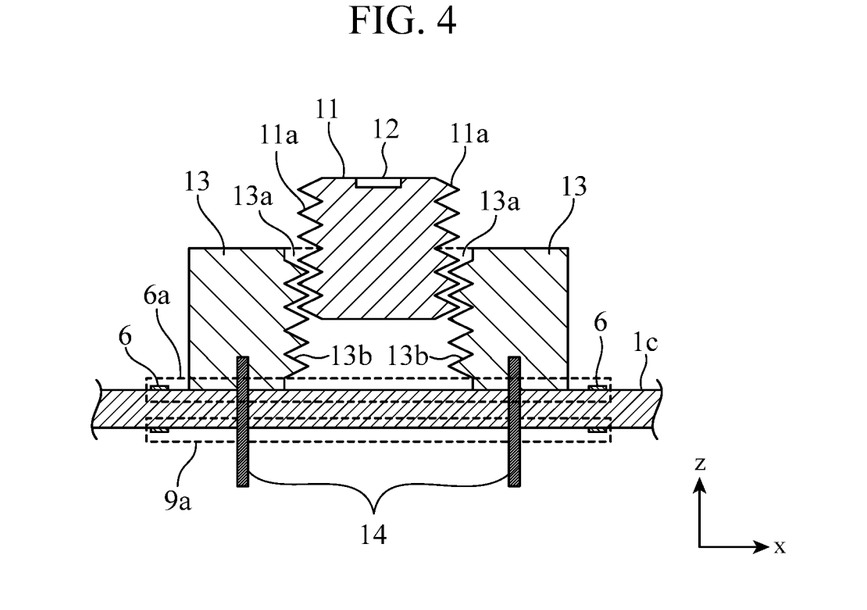

FIG. 4 is a cross-sectional view showing an A-A' cross section of FIGS. 2 and 3, with a magnetic core 11 being away from a loop portion 6a of the first conductor layer 1a.

Figure 5:
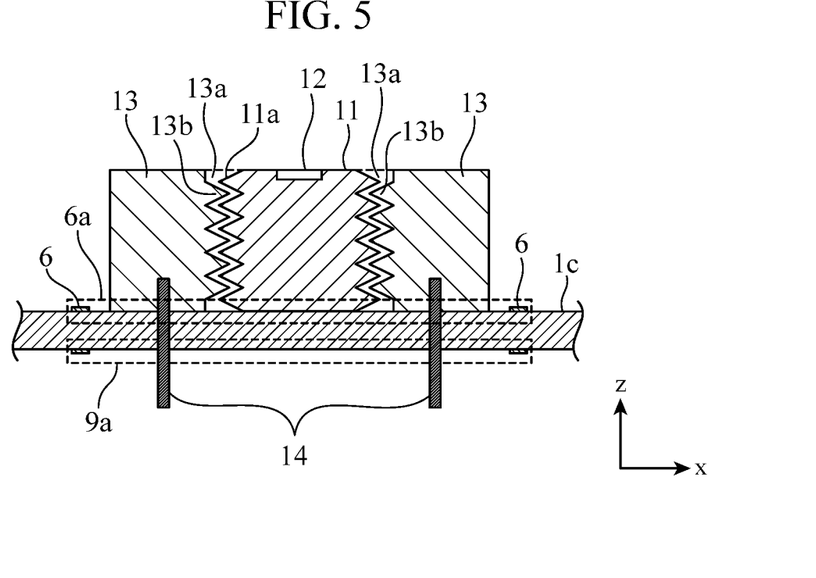

FIG. 5 is a cross-sectional view showing the A-A' cross section of FIGS. 2 and 3, with the magnetic core 11 being close to the loop portion 6a of the first conductor layer 1a.

In FIGS. 1 to 5, a z-direction is a direction orthogonal to each of the first conductor layer 1a and the second conductor layer 1b, an x-direction is a horizontal direction of each of the first conductor layer 1a and the second conductor layer 1b, and a y-direction is a direction orthogonal to each of the z-direction and the x-direction.

The printed circuit board 1 is a multilayer board having the first conductor layer 1a and the second conductor layer 1b.

Reference sign "1c" indicates an insulating layer of the printed circuit board 1 and is omitted in FIGS. 1 to 3.

A first circuit 2 is a circuit mounted on the first conductor layer 1a in the printed circuit board 1.

A second circuit 3 is a circuit mounted on the first conductor layer 1a of the printed circuit board 1.

A ground line 4 is connected at its one end to the first circuit 2 and connected at its other end to the second circuit 3.

A capacitor 5 is connected at its one end to the ground line 4 and connected at its other end to each of one end of a first conductor wiring line 6 and the other end of a connecting conductor 10.

A lead 5a is a lead of the capacitor 5 to the ground line 4.

A lead 5b is a lead of the capacitor 5 to a connecting point between the first conductor wiring line 6 and the connecting conductor 10.

The first conductor wiring line 6 is connected at its one end to each of the other end of the capacitor 5 and the other end of the connecting conductor 10, and connected at its other end to an input and output terminal 3a of the second circuit 3.

The first conductor wiring line 6 is wired on the first conductor layer 1a. A part of the first conductor wiring line 6 is wired in loop shape, and the loop portion 6a which is a portion of the first conductor wiring line 6 wired in loop shape acts as a first reactor.

A conductor wiring line 7 is connected at its one end to an input and output terminal 2a of the first circuit 2 and connected at its other end to one end of a connecting conductor 8.

The connecting conductor 8 is a via connected at its one end to the other end of the conductor wiring line 7 and connected at its other end to one end of a second conductor wiring line 9.

The second conductor wiring line 9 is connected at its one end to the other end of the connecting conductor 8 and connected at its other end to one end of the connecting conductor 10.

The second conductor wiring line 9 is wired on the second conductor layer 1b. A part of the second conductor wiring line 9 is wired in loop shape, and a loop portion 9a which is a portion of the second conductor wiring line 9 wired in loop shape acts as a second reactor.

In the loop portion 6a and the loop portion 9a, their respective conductor wiring lines go around in the same direction and are coaxially arranged.

The first reactor and the second reactor are coupled to each other by a magnetic field with a mutual inductance M.

The connecting conductor 10 is a via connected at its one end to the other end of the second conductor wiring line 9 and connected at its other end to each of the other end of the capacitor 5 and the one end of the first conductor wiring line 6.

The conductor wiring line 7, the connecting conductor 8, the second conductor wiring line 9, the connecting conductor 10, and the first conductor wiring line 6 form a power supply pattern that connects the first circuit 2 to the second circuit 3.

The magnetic core 11 is a member including a magnetic material that influences the magnitude of magnetic field coupling between the first conductor wiring line 6 and the second conductor wiring line 9.

The electrical and electronic equipment shown in FIG. 1 includes a distance adjusting member that accepts adjustment of the distance between the loop portion 6a and the magnetic core 11, and the distance adjusting member includes a slit 12 and a core supporting member 13.

The slit 12 is made at an end portion on a+z-direction side of the magnetic core 11.

The slit 12 has a shape that fits a flathead screwdriver or the like, and a flathead screwdriver or the like is inserted into the slit 12.

The core supporting member 13 is a non-magnetic member provided in an inside region of the loop portion 6a on a plane on the +z-direction side of the first conductor layer 1a.

The core supporting member 13 has a through hole 13a for insertion of the magnetic core 11 thereinto, and supports the magnetic core 11 inserted into the through hole 13a.

In the electrical and electronic equipment shown in FIG. 1, the core supporting member 13 is provided on the plane on the +z-direction side of the first conductor layer 1a. However, this is merely an example, and the core supporting member 13 may be provided in an inside region of the loop portion 9a on a plane on a−z-direction side of the second conductor layer 1b.

The magnetic core 11 and the core supporting member 13 have respective threads that mesh with each other.

The magnetic core 11 has a male thread 11a on its side, and the through hole 13a of the core supporting member 13 has a female thread 13b that meshes with the male threads 11a.

By a user rotating the magnetic core 11 by rotating a flathead screwdriver or the like inserted into the slit 12, the magnetic core 11 moves in the z-direction by the action of the threads.

The movement in a+z-direction of the magnetic core 11 is movement in a direction in which the magnetic core 11 moves away from the loop portion 6a, and the movement in a−z-direction of the magnetic core 11 is movement in a direction in which the magnetic core 11 approaches the loop portion 6a.

Fixing pins 14 are pins for fixing the core supporting member 13 to the printed circuit board 1.

Figure 6:
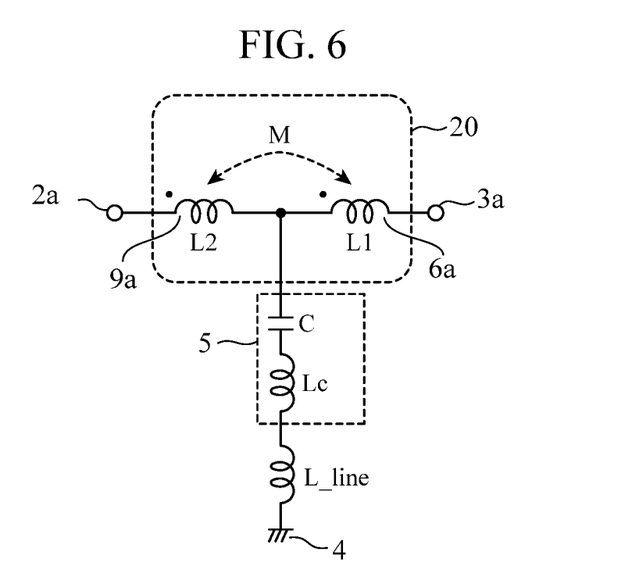
FIG. 6 is a circuit diagram of a portion from an input and output terminal 2a of a first circuit 2 to an input and output terminal 3a of a second circuit 3.

FIG. 6 is a circuit diagram of a portion from the input and output terminal 2a of the first circuit 2 to the input and output terminal 3a of the second circuit 3.

Next, operation of a noise filter included in the electrical and electronic equipment shown in FIG. 1 will be described by referring to FIG. 6.

The noise filter is provided in the printed circuit board 1 to prevent propagation of electromagnetic noise generated from the first circuit 2 to the second circuit 3 and propagation of electromagnetic noise generated from the second circuit 3 to the first circuit 2.

The capacitor 5 of the noise filter bypasses electromagnetic noise generated from the first circuit 2 or electromagnetic noise generated from the second circuit 3 to the ground line 4, thereby preventing the electromagnetic noise from propagating through the second circuit 3 or the first circuit 2 via the power supply pattern.

As shown in FIG. 6, the capacitor 5 has an inductance Lc in addition to a capacitance C.

The lead 5a and the lead 5b also have inductances. In FIG. 6, a sum total of the inductance of the lead 5a and the inductance of the lead 5b is represented as L line.

Since the inductance Lc and the inductance L line are connected in series with each other, a total of the inductance Lc and the inductance L line is hereinafter described as ESL.

The loop portion 6a acting as the first reactor has a self-inductance L1, and the loop portion 9a acting as the second reactor has a self-inductance L2.

The first reactor and the second reactor are coupled to each other by a magnetic field with the mutual inductance M.

The value of the mutual inductance M is determined by structure parameters such as the distance between the loop portion 6a and the loop portion 9a, i.e., the thickness of the insulating layer 1c of the printed circuit board 1, in addition to the loop size of each of the loop portion 6a and the loop portion 9a.

In addition, the value of the mutual inductance M is determined by whether or not a magnetic material is present near the loop portion 6a or the loop portion 9a.

In addition, the value of the mutual inductance M increases as shared magnetic flux between the first reactor and the second reactor increases.

Therefore, the value of the mutual inductance M is larger when the magnetic core 11 including a magnetic material having the property of collecting magnetic flux is close to the loop portion 6a as shown in FIG. 5 than when the magnetic core 11 is away from the loop portion 6a as shown in FIG. 4.

Figure 7:
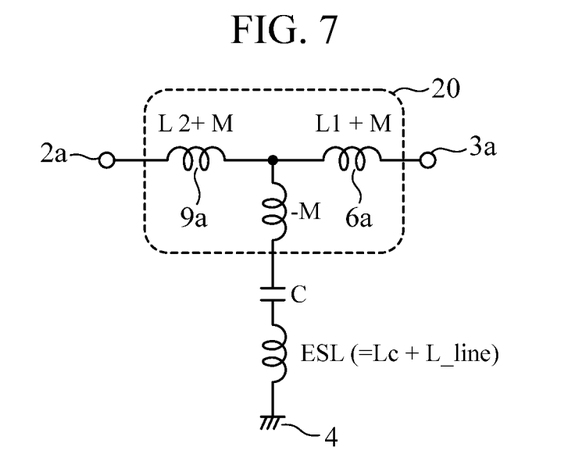
FIG. 7 is a circuit diagram in which a portion 20 including a first reactor and a second reactor is converted to an equivalent circuit.

Here, when in FIG. 6 a portion 20 including the first reactor and the second reactor is converted to an equivalent circuit, a circuit diagram of the portion from the input and output terminal 2a of the first circuit 2 to the input and output terminal 3a of the second circuit 3 is as shown in FIG. 7.

FIG. 7 is a circuit diagram in which the portion 20 including the first reactor and the second reactor is converted to an equivalent circuit.

A circuit between the input and output terminal 2a and the input and output terminal 3a is, as shown in FIG. 7, a circuit in which an equivalent negative inductance having the value of −M is inserted in series with the capacitance C and the inductance ESL.

Therefore, an inductance in series with the capacitance C is ESL-M and thus can cancel out the inductance ESL by an amount corresponding to the mutual inductance M.

In general, in an inductance, the higher the frequency, the higher the impedance, and thus, the inductance ESL acts to deteriorate the effect of suppressing high-frequency components of electromagnetic noise.

However, in the electrical and electronic equipment shown in FIG. 1, since the inductance ESL is canceled out by the equivalent negative inductance having the value of −M, the deterioration of the effect of suppressing high-frequency components of electromagnetic noise is less likely to occur.

By designing the structure parameters in such a manner that ESL-M=0, there is no influence of the inductance ESL, and the effect of suppressing high-frequency components of electromagnetic noise increases. Since the inductance ESL can be estimated upon designing by using an approximate expression or electromagnetic field analysis, it is possible to design the structure parameters in such a manner that ESL-M=0.

However, due to the influence of dimensional tolerances, variation, or the like, upon manufacturing a board, an actual inductance ESL may differ from an inductance ESL estimated upon designing, and actual structure parameters may differ from structure parameters estimated upon designing.

Therefore, the amount of cancellation of the inductance ESL by the equivalent negative inductance having the value of −M may be smaller than the amount of cancellation estimated upon designing (ESL-M>0). In addition, the amount of cancellation of the inductance ESL by the equivalent negative inductance having the value of −M may be larger than the amount of cancellation estimated upon designing (ESL-M<0).

The electrical and electronic equipment shown in FIG. 1 includes the distance adjusting member that accepts adjustment of the distance between the loop portion 6a and the magnetic core 11. The distance adjusting member can set ESL-M=0 by adjusting the amount of cancellation of the inductance ESL by the equivalent negative inductance having the value of −M.

Figure 8A:
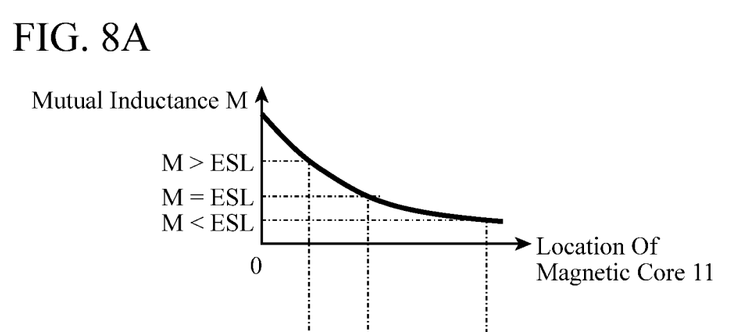
FIG. 8A is an explanatory diagram showing a relationship between the location of the magnetic core 11 and a mutual inductance M.
Figure 8B:
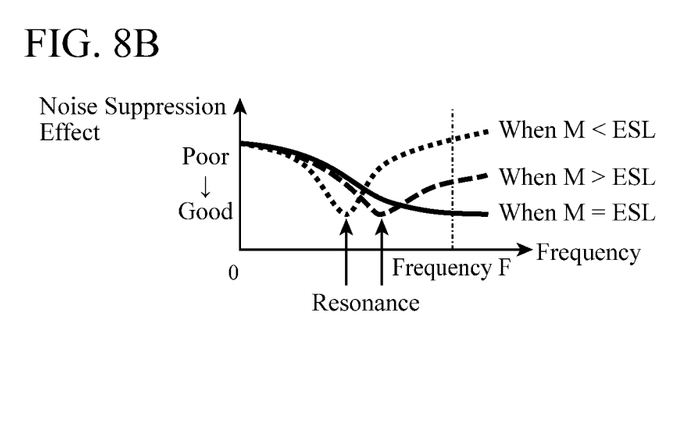
FIG. 8B is an explanatory diagram showing frequency characteristics of the mutual inductance M and noise suppression effect.
Figure 8C:
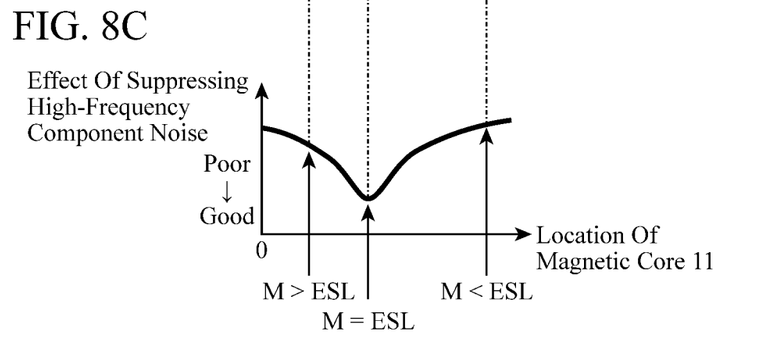
FIG. 8C is an explanatory diagram showing a relationship between the location of the magnetic core 11 and the effect of suppressing high-frequency component noise.

Here, FIG. 8 is an explanatory diagram showing effects of the noise filter according to the first embodiment.

FIG. 8A is an explanatory diagram showing a relationship between the location of the magnetic core 11 and the mutual inductance M.

FIG. 8B is an explanatory diagram showing frequency characteristics of the mutual inductance M and noise suppression effect.

FIG. 8C is an explanatory diagram showing a relationship between the location of the magnetic core 11 and the effect of suppressing high-frequency component noise.

A relationship between the location of the magnetic core 11 and the noise suppression effect will be described below by referring to FIG. 8.

Here, for convenience of description, it is assumed that in a state in which, as shown in FIG. 5, the magnetic core 11 is close to the loop portion 6a of the first conductor layer 1a and is almost in contact with the first conductor layer 1a, the location of the magnetic core 11 (the distance between the magnetic core 11 and the first conductor layer 1a) is "0".

As shown in FIG. 8A, the mutual inductance M is highest when the location of the magnetic core 11 is "0", and decreases as the magnetic core 11 moves away from the first conductor layer 1a.

FIG. 8B shows that when the mutual inductance M does not equal to the inductance ESL, the effect of suppressing high-frequency components of electromagnetic noise that are higher than or equal to resonance frequency deteriorates.

Resonance occurring here is LC resonance by a combination of the capacitance C and (ESL-M) shown in FIG. 7, and thus, resonance does not occur when M=ESL. Therefore, when M=ESL, the effect of suppressing high-frequency components whose frequency is F does not deteriorate.

By the user rotating the magnetic core 11 by rotating a flathead screwdriver or the like inserted into the slit 12, thereby adjusting the location of the magnetic core 11 to obtain M=ESL, so that the effect of suppressing high-frequency components of electromagnetic noise can be increased.

FIG. 8C shows that when M=ESL, the best effect of suppressing high-frequency component noise whose frequency is F is obtained.

In the above-described first embodiment, the noise filter is configured to include the magnetic core 11 including a magnetic material; and the distance adjusting member that accepts adjustment of the distance between at least one of loop portions and the magnetic core 11, the loop portions being wiring portions in loop shape of the respective first and second conductor wiring lines 6 and 9. Therefore, the noise filter can increase the effect of suppressing high-frequency components of electromagnetic noise without performing re-designing and re-manufacturing of a printed circuit board.

In the electrical and electronic equipment shown in FIG. 1, the loop portion 6a and the loop portion 9a are coaxially arranged so as to substantially overlap each other when the electrical and electronic equipment is viewed in the z-direction.

However, it is not limited thereto, and the loop portion 6a and the loop portion 9a may be arranged so as to only partially overlap each other when the electrical and electronic equipment is viewed in the z-direction. Note, however, that in a portion in which the loop portion 6a and the loop portion 9a only partially overlap each other, magnetic flux occurring in the first reactor and magnetic flux occurring in the second reactor need to be in the same direction.

In the electrical and electronic equipment shown in FIG. 1, the first circuit 2 includes the input and output terminal 2a, and the second circuit 3 includes the input and output terminal 3a.

However, it is sufficient that the one end of the conductor wiring line 7 is connected to the first circuit 2 and the other end of the first conductor wiring line 6 is connected to the second circuit 3.

Therefore, the first circuit 2 does not need to include the input and output terminal 2a, and the second circuit 3 does not need to include the input and output terminal 3a.

The electrical and electronic equipment shown in FIG. 1 includes the magnetic core 11 including a magnetic material.

The magnetic core 11 may be any member as long as the member includes a magnetic material, and may be a member including a magnetic material such as iron, ferrite, or stainless steel and a non-magnetic material such as resin.

In the electrical and electronic equipment shown in FIG. 1, the magnetic core 11 that can move in the z-direction by the action of the threads is shown.

The magnetic core 11 is not limited to one that moves by the action of the threads, provided that the magnetic core 11 can move along the core supporting member 13.

Therefore, the magnetic core 11 and the core supporting member 13 do not need to have respective threads that mesh with each other, and the core supporting member 13 may be structured to accept movement of the magnetic core 11 by application of pressure or impact to the magnetic core 11.

When the core supporting member 13 is structured to accept movement of the magnetic core 11 by application of pressure or impact to the magnetic core 11, it is sufficient that the distance adjusting member includes the core supporting member 13, and thus, the distance adjusting member does not need to include the slit 12.

In the electrical and electronic equipment shown in FIG. 1, the magnetic core 11 is supported by the core supporting member 13 by friction force between the male thread 11a and the female thread 13b.

However, it is not limited thereto, and after adjustment of the distance by the distance adjusting member, the magnetic core 11 and the core supporting member 13 may be fixed together using an adhesive, a thermoplastic resin, or the like.

In the electrical and electronic equipment shown in FIG. 1, the magnetic core 11 has a cylindrical shape.

Figure 9:
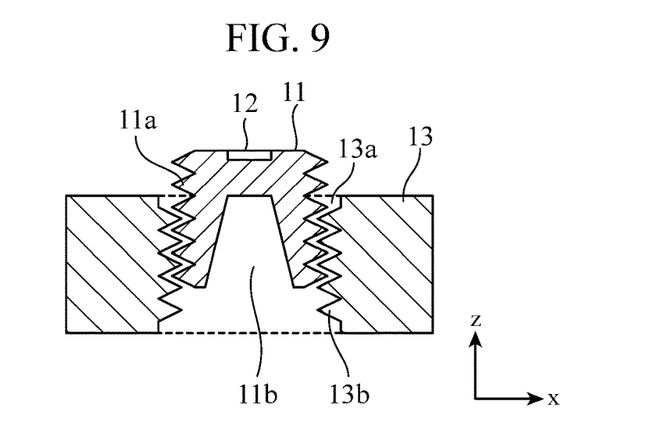
FIG. 9 is a cross-sectional view showing the A-A' cross section of FIGS. 2 and 3.

However, this is merely an example and the magnetic core 11 may have a shape in which, as shown in FIG. 9, the magnetic core 11 has a recessed portion 11b at an end portion on the −z-direction side of the magnetic core 11.

Figure 10:
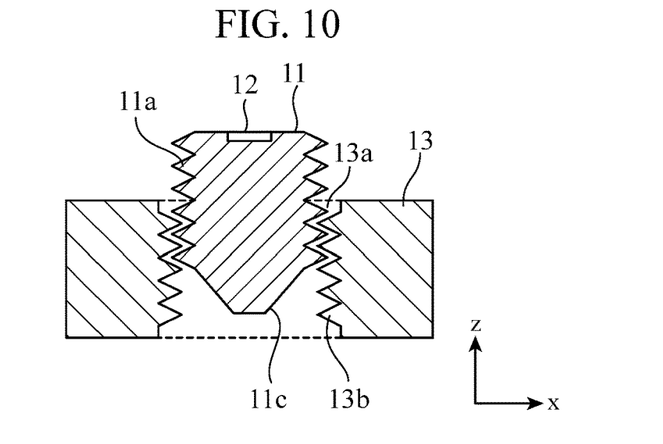
FIG. 10 is a cross-sectional view showing the A-A' cross section of FIGS. 2 and 3.

In addition, the magnetic core 11 may have a shape in which, as shown in FIG. 10, the magnetic core 11 has a projecting portion 11c at an end portion on the −z-direction side of the magnetic core 11.

FIGS. 9 and 10 are cross-sectional views showing the A-A' cross section of FIGS. 2 and 3.

In the electrical and electronic equipment shown in FIG. 1, the size on an x-y plane of the core supporting member 13 is smaller than the size on the x-y plane of the loop portion 6a.

It is sufficient that the core supporting member 13 can support the magnetic core 11, and thus, the size on the x-y plane of the magnetic core 11 may be larger than the size on the x-y plane of the loop portion 6a.

In the electrical and electronic equipment shown in FIG. 1, it is configured that the magnetic core 11 is almost in contact with the first conductor layer 1a in a state in which the magnetic core 11 is closest to the loop portion 6a of the first conductor layer 1a.

However, it is not limited thereto, and it may be configured that the magnetic core 11 is not to come into contact with the first conductor layer 1a even when the magnetic core 11 is brought closest to the loop portion 6a of the first conductor layer 1a.

In the electrical and electronic equipment shown in FIG. 1, the magnetic core 11 is disposed in the inside region of the loop portion 6a.

However, it is not limited thereto, and only a part of the magnetic core 11 may be disposed in the inside region of the loop portion 6a.

In the electrical and electronic equipment shown in FIG. 1, the core supporting member 13 is a non-magnetic member.

However, it is not limited thereto, and the core supporting member 13 may be a member made of a composite material including a non-magnetic material and a magnetic material, or may be a member made of a magnetic material.

In the electrical and electronic equipment shown in FIG. 1, the core supporting member 13 is fixed to the printed circuit board 1 by the fixing pins 14.

When the core supporting member 13 is a member made of resin, the core supporting member 13 may be fixed to the printed circuit board 1 by allowing the core supporting member 13 to be deformed using heat, etc.

In the electrical and electronic equipment shown in FIG. 1, the printed circuit board 1 includes the first conductor layer 1a and the second conductor layer 1b.

However, it is not limited thereto, and the printed circuit board 1 may have three or more conductor layers or a single conductor layer.

Note, however, that when the printed circuit board 1 has a single conductor layer, a plane on the +z-direction side of the printed circuit board 1 is considered the first conductor layer 1a and a plane on the −z-direction side of the printed circuit board 1 is considered the second conductor layer 1b.

In the electrical and electronic equipment shown in FIG. 1, the first conductor wiring line 6 forms the first reactor and the second conductor wiring line 9 forms the second reactor.

The first reactor may be formed using a metal wiring line such as a busbar instead of the first conductor wiring line 6, and the second reactor may be formed using a metal wiring line such as a busbar instead of the second conductor wiring line 9.

In addition, as for the connecting conductor 8 and the connecting conductor 10, metal wiring lines such as busbars may be used.

In the electrical and electronic equipment shown in FIG. 1, the printed circuit board 1 includes the first circuit 2 and the second circuit 3.

The first circuit 2 and the second circuit 3 each may be any component as long as the component forms the electrical and electronic equipment, and correspond to a switching power supply circuit, an inverter circuit, a connector, or the like.

In the electrical and electronic equipment shown in FIG. 1, the conductor wiring line 7, the connecting conductor 8, the second conductor wiring line 9, the connecting conductor 10, and the first conductor wiring line 6 form a power supply pattern that connects the first circuit 2 to the second circuit 3.

However, the conductor wiring line 7, the connecting conductor 8, the second conductor wiring line 9, the connecting conductor 10, and the first conductor wiring line 6 are not limited to forming a power supply pattern and may form, for example, a conductor wiring line that transmits signals.

Second Embodiment

In a second embodiment, electrical and electronic equipment in which a distance adjusting member accepts movement of the magnetic core 31 in the horizontal direction of the first conductor layer 1a or the horizontal direction of the second conductor layer 1b will be described.

Figure 11:
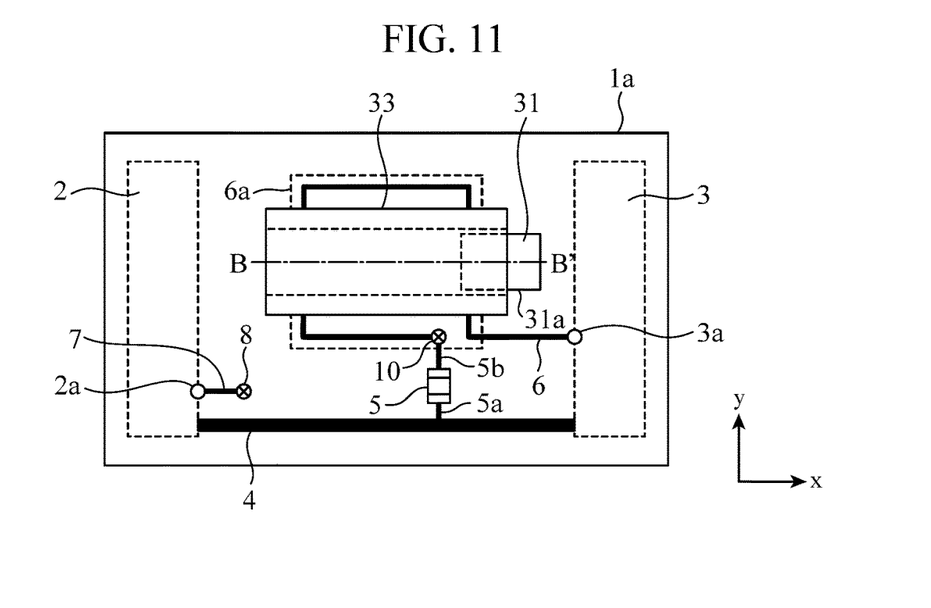
FIG. 11 is a plan view showing the first conductor layer 1a in the printed circuit board 1 of electrical and electronic equipment according to a second embodiment.

FIG. 11 is a plan view showing the first conductor layer 1a of the printed circuit board 1 of electrical and electronic equipment according to the second embodiment.

Figure 12:
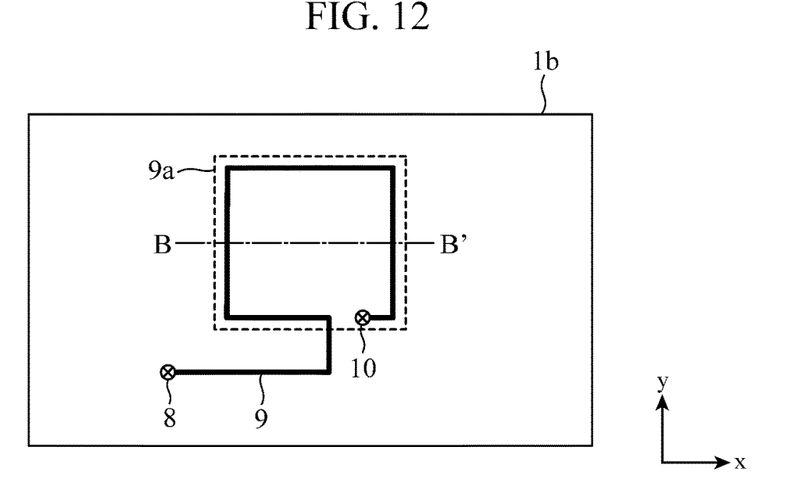
FIG. 12 is a plan view showing the second conductor layer 1b in the printed circuit board 1 of the electrical and electronic equipment according to the second embodiment.

FIG. 12 is a plan view showing the second conductor layer 1b of the printed circuit board 1 of the electrical and electronic equipment according to the second embodiment.

Figure 13:
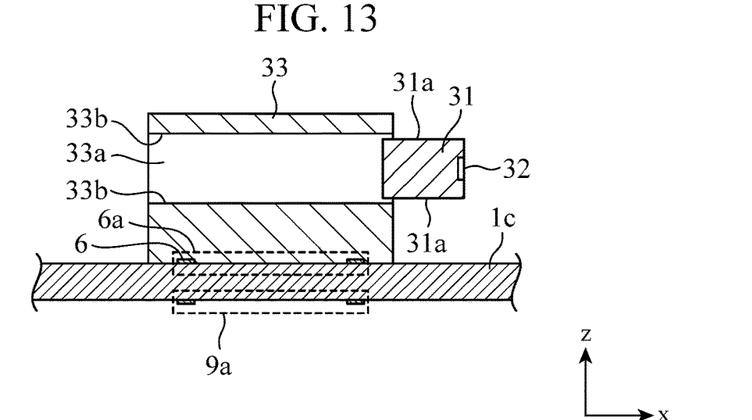
FIG. 13 is a cross-sectional view showing a B-B' cross section of FIGS. 11 and 12, with a magnetic core 31 being not disposed inside the loop portion 6a, when the electrical and electronic equipment is viewed in a z-direction.

FIG. 13 is a cross-sectional view showing a B-B' cross section of FIGS. 11 and 12, with a magnetic core 31 being not disposed inside the loop portion 6a when the electrical and electronic equipment is viewed in the z-direction.

Figure 14:
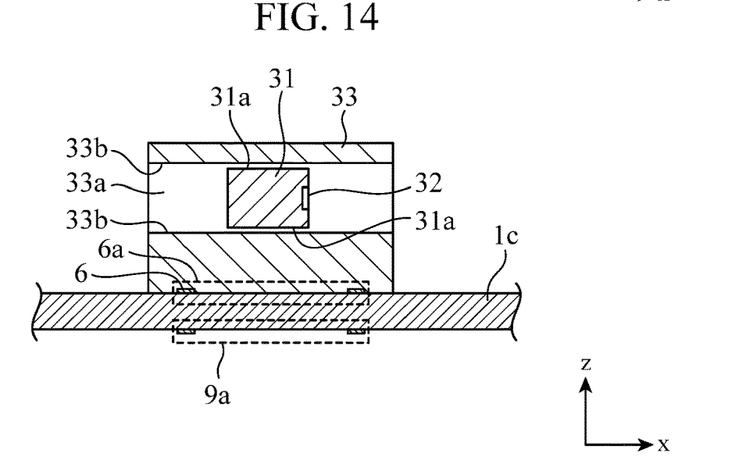
FIG. 14 is a cross-sectional view showing the B-B' cross section of FIGS. 11 and 12, with the magnetic core 31 being disposed inside the loop portion 6a, when the electrical and electronic equipment is viewed in the z-direction.

FIG. 14 is a cross-sectional view showing the B-B' cross section of FIGS. 11 and 12, with the magnetic core 31 being disposed inside the loop portion 6a when the electrical and electronic equipment is viewed in the z-direction.

In FIGS. 11 to 14, the same reference signs as those of FIGS. 1 to 5 indicate the same or corresponding portions and thus description thereof is omitted.

The magnetic core 31 is a member including a magnetic material that influences the magnitude of magnetic field coupling between the first conductor wiring line 6 and the second conductor wiring line 9.

The electrical and electronic equipment of the second embodiment includes a distance adjusting member that accepts adjustment of the distance between the loop portion 6a and the magnetic core 31, and the distance adjusting member includes a slit 32 and a core supporting member 33.

The slit 32 is made at an end portion on a+x-direction side of the magnetic core 31.

The slit 32 has a shape that fits a flathead screwdriver or the like, and a flathead screwdriver or the like is inserted into the slit 32.

The core supporting member 33 is a non-magnetic member provided in a region that includes the loop portion 6a on a plane on the +z-direction side of the first conductor layer 1a.

The core supporting member 33 has a through hole 33a for insertion of the magnetic core 31 thereinto, and supports the magnetic core 31 inserted into the through hole 33a.

In the electrical and electronic equipment of the second embodiment, the core supporting member 33 is provided on the plane on the +z-direction side of the first conductor layer 1a. However, this is merely an example, and the core supporting member 33 may be provided in a region that includes the loop portion 9a on a plane on the −z-direction side of the second conductor layer 1b.

The magnetic core 31 and the core supporting member 33 have respective threads that mesh with each other.

The magnetic core 31 has a male thread 31a on its side, and the through hole 33a of the core supporting member 33 has a female thread 33b that meshes with the male thread 31a of the magnetic core 31.

By the user rotating the magnetic core 31 by rotating a flathead screwdriver or the like inserted into the slit 32, the magnetic core 31 moves in the x-direction by the action of the threads.

In the electrical and electronic equipment of the first embodiment, the magnetic core 11 can move in the z-direction, whereas in the electrical and electronic equipment of the second embodiment, the magnetic core 31 can move in the x-direction.

The electrical and electronic equipment of the first embodiment and the electrical and electronic equipment of the second embodiment are the same except that the movement direction of the magnetic core 11 and the movement direction of the magnetic core 31 differ from each other.

Therefore, in the electrical and electronic equipment of the second embodiment, circuit diagrams of a portion from the input and output terminal 2a of the first circuit 2 to the input and output terminal 3a of the second circuit 3 are the same as those of FIGS. 6 and 7 as with the electrical and electronic equipment of the first embodiment.

FIG. 13 shows a state in which the magnetic core 31 is not disposed inside the loop portion 6a when the electrical and electronic equipment is viewed in the z-direction.

The state in which the magnetic core 31 is not disposed inside the loop portion 6a corresponds to a state in which the loop portion 6a and the magnetic core 31 are away in distance from each other.

Therefore, the magnetic core 31 in the state in which the magnetic core 31 is not disposed inside the loop portion 6a has a small influence on the magnitude of magnetic field coupling between the first conductor wiring line 6 and the second conductor wiring line 9.

FIG. 14 shows a state in which the magnetic core 31 is disposed inside the loop portion 6a when the electrical and electronic equipment is viewed in the z-direction.

The state in which the magnetic core 31 is disposed inside the loop portion 6a corresponds to a state in which the loop portion 6a and the magnetic core 31 are close in distance to each other.

Therefore, the magnetic core 31 in the state in which the magnetic core 31 is disposed inside the loop portion 6a has a large influence on the magnitude of magnetic field coupling between the first conductor wiring line 6 and the second conductor wiring line 9.

The value of the mutual inductance M changes depending on the degree of influence of the magnetic core 31, and thus is larger when the magnetic core 31 is disposed inside the loop portion 6a as shown in FIG. 14 than that when the magnetic core 31 is not disposed inside the loop portion 6a as shown in FIG. 13.

The value of the mutual inductance M is smaller when only a part of the magnetic core 31 is disposed inside the loop portion 6a than that when the entire magnetic core 31 is disposed inside the loop portion 6a.

In addition, the value of the mutual inductance M is larger when only a part of the magnetic core 31 is disposed inside the loop portion 6a than that when the entire magnetic core 31 is not disposed inside the loop portion 6a.

In addition, when the entire magnetic core 31 is disposed inside the loop portion 6a, the value of the mutual inductance M increases as the location of the magnetic core 31 is closer to a central location of the inside of the loop portion 6a.

By the distance adjusting member adjusting the location of the magnetic core 31 by allowing the magnetic core 31 to move in the x-direction, the influence of the inductance ESL can be eliminated.

Specifically, by the user rotating a flathead screwdriver or the like inserted into the slit 32, thereby adjusting the location of the magnetic core 31 to obtain M=ESL, so that the effect of suppressing high-frequency components of electromagnetic noise can be increased.

In the above-described second embodiment, a noise filter is configured to include the magnetic core 31; and the distance adjusting member that accepts adjustment of the distance between at least one of loop portions and the magnetic core 31, the loop portions being wiring portions in loop shape of the respective first and second conductor wiring lines 6 and 9. Therefore, the noise filter can increase the effect of suppressing high-frequency components of electromagnetic noise without performing re-designing and re-manufacturing of a printed circuit board.

In addition, in the second embodiment, the noise filter is configured in such a manner that the distance adjusting member accepts movement of the magnetic core 31 in the horizontal direction of the first conductor layer 1a or the horizontal direction of the second conductor layer 1b. Therefore, the noise filter can reduce space in the z-direction over the noise filter of the first embodiment.

In the electrical and electronic equipment of the second embodiment, the distance adjusting member accepts movement of the magnetic core 31 in the x-direction.

However, it is sufficient that the distance adjusting member accepts movement of the magnetic core 31 in the horizontal direction of the first conductor layer 1a or the horizontal direction of the second conductor layer 1b, and thus, the distance adjusting member may accept, for example, movement of the magnetic core 31 in the y-direction. In addition, the distance adjusting member may accept movement of the magnetic core 31 in any direction in the x-y plane of the first conductor layer 1a or the second conductor layer 1b.

In the electrical and electronic equipment of the second embodiment, the magnetic core 31 that can move in the x-direction by the action of the threads is shown.

The magnetic core 31 is not limited to one that moves by the action of the threads, provided that the magnetic core 31 can move along the core supporting member 33.

Therefore, the magnetic core 31 and the core supporting member 33 do not need to have respective threads that mesh with each other, and the core supporting member 33 may be structured to accept movement of the magnetic core 31 by application of pressure or impact to the magnetic core 31.

When the core supporting member 33 is structured to accept movement of the magnetic core 31 by application of pressure or impact to the magnetic core 31, it is sufficient that the distance adjusting member includes the core supporting member 33, and thus, the distance adjusting member does not need to include the slit 32.

In the electrical and electronic equipment of the second embodiment, the magnetic core 31 is supported by the core supporting member 33 by friction force between the male thread 31a and the female thread 33b.

However, it is not limited thereto, and after adjustment of the distance by the distance adjusting member, the magnetic core 31 and the core supporting member 33 may be fixed together using an adhesive, a thermoplastic resin, or the like.

Third Embodiment

In the electrical and electronic equipment of the first embodiment, the magnetic core 11 is inserted into the through hole 13a of the core supporting member 13.

In a third embodiment, electrical and electronic equipment in which the magnetic core 11 is inserted into a through hole 40 made in the printed circuit board 1 will be described.

The electrical and electronic equipment of the third embodiment differs from the electrical and electronic equipment of the first embodiment in that the electrical and electronic equipment of the third embodiment does not include the core supporting member 13, but other portions are the same.

Figure 15:
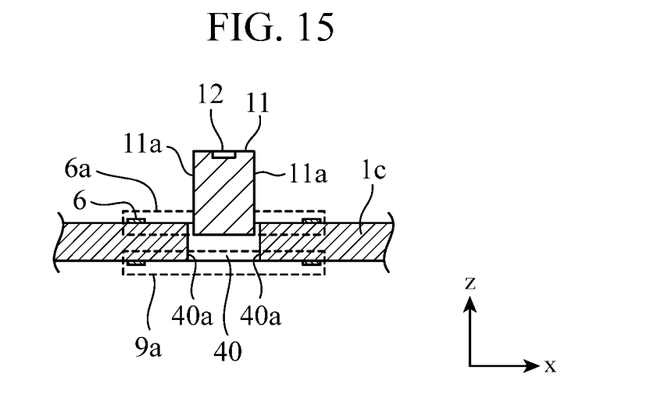
FIG. 15 is a cross-sectional view in a state in which the magnetic core 11 of electrical and electronic equipment according to a third embodiment is away from a loop portion 9a of the second conductor layer 1b.

FIG. 15 is a cross-sectional view in a state in which the magnetic core 11 of the electrical and electronic equipment according to the third embodiment is away from the loop portion 9a of the second conductor layer 1b.

Figure 16:
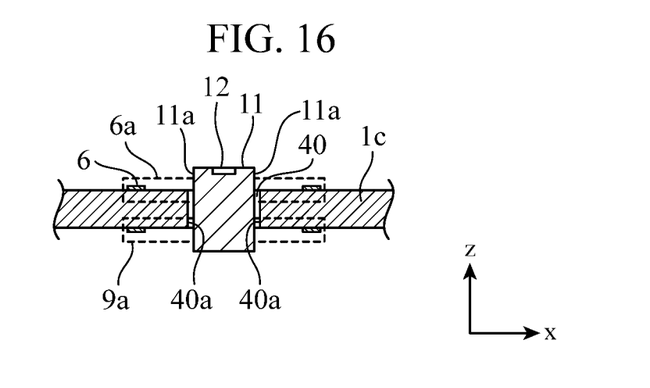
FIG. 16 is a cross-sectional view in a state in which the magnetic core 11 of the electrical and electronic equipment according to the third embodiment is close to the loop portion 9a of the second conductor layer 1b.

FIG. 16 is a cross-sectional view in a state in which the magnetic core 11 of the electrical and electronic equipment according to the third embodiment is close to the loop portion 9a of the second conductor layer 1b.

In FIGS. 15 and 16, the same reference signs as those of FIGS. 1 to 5 indicate the same or corresponding portions and thus description thereof is omitted.

The magnetic core 11 has the male thread 11a such as those shown in FIGS. 4 and 5 on its side.

The through hole 40 for insertion of the magnetic core 11 thereinto is made in each of the inside region of the loop portion 6a and the inside region of the loop portion 9a.

The through hole 40 has, on its inner wall, a female thread 40a that meshes with the male thread 11a of the magnetic core 11.

The electrical and electronic equipment of the third embodiment includes a distance adjusting member that accepts adjustment of the distance between each of the loop portion 6a and the loop portion 9a and the magnetic core 11, and the distance adjusting member includes the slit 12, the through hole 40, and the female thread 40a.

FIG. 15 shows a state in which a part of the magnetic core 11 is inserted into the through hole 40.

FIG. 16 shows a state in which the most part of the magnetic core 11 is inserted into the through hole 40.

The magnetic core 11 in the state in which the most part of the magnetic core 11 is inserted into the through hole 40 has a larger influence on the magnitude of magnetic field coupling than the magnetic core 11 in the state in which a part of the magnetic core 11 is inserted into the through hole 40.

The value of the mutual inductance M changes depending on the degree of influence of the magnetic core 11, and thus is larger when the most part of the magnetic core 11 is inserted into the through hole 40 as shown in FIG. 16 than that when a part of the magnetic core 11 is inserted into the through hole 40 as shown in FIG. 15.

By the distance adjusting member adjusting the location of the magnetic core 11 by allowing the magnetic core 11 to move in the z-direction, the influence of the inductance ESL can be eliminated.

Specifically, by the user rotating the magnetic core 11 by rotating a flathead screwdriver or the like inserted into the slit 12, thereby adjusting the location of the magnetic core 11 to obtain M=ESL, so that the effect of suppressing high-frequency components of electromagnetic noise can be increased.

As a result, as with the electrical and electronic equipment of the first embodiment, the electrical and electronic equipment of the third embodiment can also increase the effect of suppressing high-frequency components of electromagnetic noise without performing re-designing and re-manufacturing of a printed circuit board.

The electrical and electronic equipment of the third embodiment does not require the core supporting member 13 and thus can reduce cost over the electrical and electronic equipment of the first embodiment.

In the electrical and electronic equipment of the third embodiment, the magnetic core 11 that can move in the z-direction by the action of the threads is shown.

The magnetic core 11 is not limited to one that moves by the action of the threads, provided that the magnetic core 11 can move along the through hole 40.

Therefore, the magnetic core 11 and the through hole 40 do not need to have respective threads that mesh with each other, and the through hole 40 may be structured to accept movement of the magnetic core 11 by application of pressure or impact to the magnetic core 11.

When the through hole 40 is structured to accept movement of the magnetic core 11 by application of pressure or impact to the magnetic core 11, it is sufficient that the distance adjusting member includes the through hole 40.

Note that the through hole 40 may be subjected to a plating process using a conductor.

Fourth Embodiment

In the electrical and electronic equipment of the first embodiment, the core supporting member 13 is provided on a plane on the +z-direction side of the first conductor layer 1a.

In a fourth embodiment, electrical and electronic equipment in which a housing 53 that holds the printed circuit board 1 serves as a core supporting member will be described.

Figure 17:
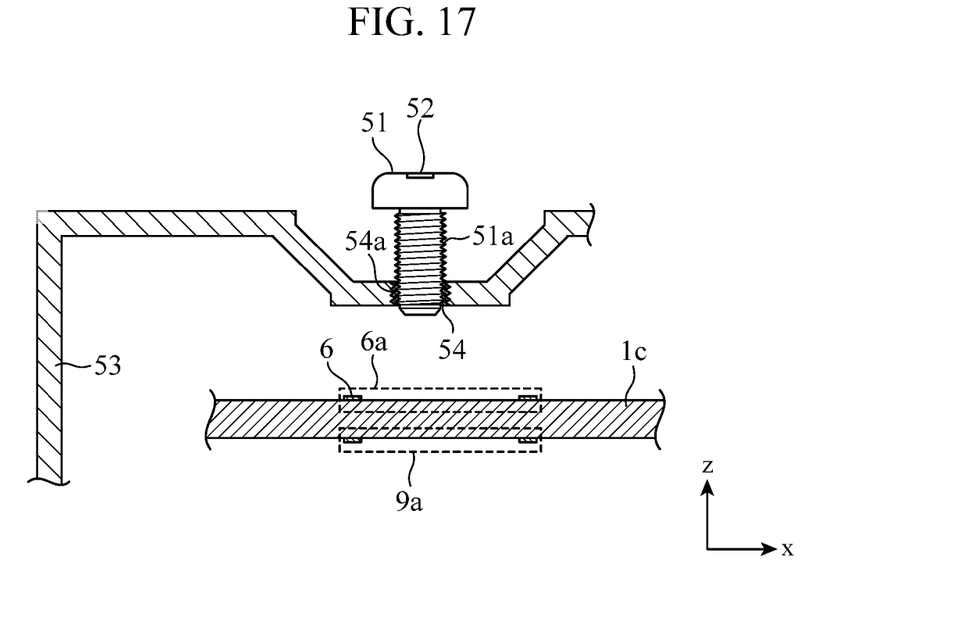

FIG. 17 is a cross-sectional view in a state in which a magnetic core 51 of the electrical and electronic equipment according to the fourth embodiment is away from the loop portion 6a of the first conductor layer 1a.

Figure 18:
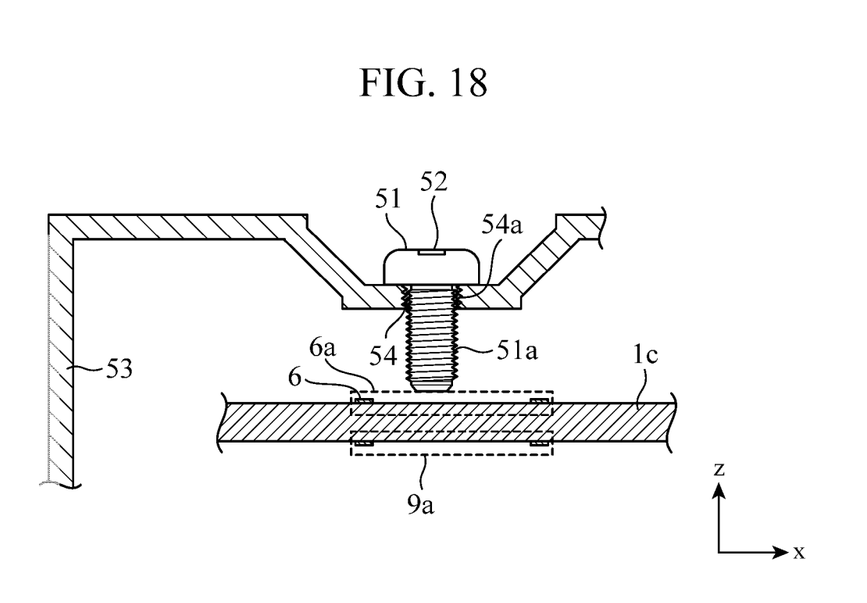

FIG. 18 is a cross-sectional view in a state in which the magnetic core 51 of the electrical and electronic equipment according to the fourth embodiment is close to the loop portion 6a of the first conductor layer 1a.

In FIGS. 17 and 18, the same reference signs as those of FIGS. 1 to 5 indicate the same or corresponding portions and thus description thereof is omitted.

The magnetic core 51 is a member including a magnetic material that influences the magnitude of magnetic field coupling between the first conductor wiring line 6 and the second conductor wiring line 9.

A slit 52 is made at an end portion on the +z-direction side of the magnetic core 51.

The slit 52 has a shape that fits a flathead screwdriver or the like, and a flathead screwdriver or the like is inserted into the slit 52.

The housing 53 is a case that holds the printed circuit board 1. The housing 53 may be a case made of metal or may be a case made of a nonmetallic material such as resin.

In a region of the housing 53 in the +z-direction of the inside region of the loop portion 6a, a through hole 54 for insertion of the magnetic core 51 thereinto is made, and the housing 53 supports the magnetic core 51 inserted into the through hole 54.

The magnetic core 51 and the through hole 54 have respective threads that mesh with each other.

The magnetic core 51 has a male thread 51a on its side, and the through hole 54 has, on its inner wall, a female thread 54a that meshes with the male thread 51a.

By the user rotating the magnetic core 51 by rotating a flathead screwdriver or the like inserted into the slit 52, the magnetic core 51 moves in the z-direction by the action of the threads.

The movement in the +z-direction of the magnetic core 51 is movement in a direction in which the magnetic core 51 moves away from the loop portion 6a, and the movement in the −z-direction of the magnetic core 51 is movement in a direction in which the magnetic core 51 approaches the loop portion 6a.

A distance adjusting member of the electrical and electronic equipment of the fourth embodiment includes the slit 52 and the housing 53.

In the electrical and electronic equipment shown in FIGS. 17 and 18, the through hole 54 is made in a region of the housing 53 in the +z-direction of the inside region of the loop portion 6a. However, this is merely an example, and the through hole 54 may be made in a region of the housing 53 in the −z-direction of the inside region of the loop portion 9a.

FIG. 17 shows a state in which the magnetic core 51 is away from the loop portion 6a of the first conductor layer 1a.

FIG. 18 shows a state in which the magnetic core 51 is close to the loop portion 6a of the first conductor layer 1a.

The magnetic core 51 in the state in which the magnetic core 51 is close to the loop portion 6a has a larger influence on the magnitude of magnetic field coupling than the magnetic core 51 in the state in which the magnetic core 51 is away from the loop portion 6a.

The value of the mutual inductance M changes depending on the degree of influence of the magnetic core 51, and thus is larger when the magnetic core 51 is close to the loop portion 6a as shown in FIG. 18 than that when the magnetic core 51 is away from the loop portion 6a as shown in FIG. 17.

By the distance adjusting member adjusting the location of the magnetic core 51 by allowing the magnetic core 51 to move in the z-direction, the influence of the inductance ESL can be eliminated.

Specifically, by the user rotating the magnetic core 51 by rotating a flathead screwdriver or the like inserted into the slit 52, thereby adjusting the location of the magnetic core 51 to obtain M=ESL, so that the effect of suppressing high-frequency components of electromagnetic noise can be increased.

As a result, as with the electrical and electronic equipment of the first embodiment, the electrical and electronic equipment of the fourth embodiment can also increase the effect of suppressing high-frequency components of electromagnetic noise without performing re-designing and re-manufacturing of a printed circuit board.

In the electrical and electronic equipment of the fourth embodiment, the housing 53 supports the magnetic core 51, and the magnetic core 51 can be rotated from the outside of the housing 53. Therefore, it can save the user the trouble of removing a case that holds the printed circuit board 1, etc., upon adjusting the location of the magnetic core 51.

The electrical and electronic equipment of the fourth embodiment includes the magnetic core 51 including a magnetic material.

The magnetic core 51 may be any member as long as the member includes a magnetic material, and may be a member including a magnetic material such as iron, ferrite, or stainless steel and a non-magnetic material such as resin.

In the electrical and electronic equipment of the fourth embodiment, the magnetic core 51 that can move in the z-direction by the action of the threads is shown.

The magnetic core 51 is not limited to one that moves by the action of the threads, provided that the magnetic core 51 can move along the through hole 54.

Therefore, the magnetic core 51 and the through hole 54 do not need to have respective threads that mesh with each other, and the housing 53 may be structured to accept movement of the magnetic core 51 by application of pressure or impact to the magnetic core 51.

When the housing 53 is structured to accept movement of the magnetic core 51 by application of pressure or impact to the magnetic core 51, it is sufficient that the distance adjusting member includes the housing 53, and thus, the distance adjusting member does not need to include the slit 52.

In the electrical and electronic equipment of the fourth embodiment, the magnetic core 51 is supported by the housing 53 by friction force between the male thread 51a and the female thread 54a.

However, it is not limited thereto, and after adjustment of the distance by the distance adjusting member, the magnetic core 51 and the housing 53 may be fixed together using an adhesive, a thermoplastic resin, or the like.

Note that in the invention of this application, a free combination of the embodiments, modifications to any component of the embodiments, or omissions of any component in the embodiments are possible within the scope of the invention.

INDUSTRIAL APPLICABILITY

The invention is suitable for a noise filter including conductor wiring lines wired in loop shape.

In addition, the invention is suitable for electrical and electronic equipment including a noise filter.

REFERENCE SIGNS LIST

1: printed circuit board, 1a: first conductor layer, 1b: second conductor layer, 1c: insulating layer, 2: first circuit, 2a: input and output terminal, 3: second circuit, 3a: input and output terminal, 4: ground line, 5: capacitor, 5a, 5b: lead, 6: first conductor wiring line, 6a: loop portion, 7: conductor wiring line, 8: connecting conductor, 9: second conductor wiring line, 9a: loop portion, 10: connecting conductor, 11: magnetic core, 11a: male thread, 11b: recessed portion, 11c: projecting portion, 12: slit (distance adjusting member), 13: core supporting member (distance adjusting member), 13a: through hole, 13b: female thread, 14: fixing pin, 20: portion including a first reactor and a second reactor, 31: magnetic core, 31a: male thread, 32: slit (distance adjusting member), 33: core supporting member (distance adjusting member), 33a: through hole, 33b: female thread, 40: through hole (distance adjusting member), 40a: female thread (distance adjusting member), 51: magnetic core, 51a: male thread, 52: slit (distance adjusting member), 53: housing (distance adjusting member), 54: through hole, 54a: female thread

The invention claimed is:

1. A noise filter comprising:
   a ground line connected between a first circuit mounted on a first conductor layer of a board and a second circuit mounted on the first conductor layer;
   a capacitor having a first end connected to the ground line;
   a first conductor wiring line connected between a second end of the capacitor and the second circuit and wired in a loop shape on the first conductor layer;
   a second conductor wiring line connected between the first circuit and the second end of the capacitor and wired in a loop shape on a second conductor layer of the board, the second conductor wiring line being coupled to the first conductor wiring line by a magnetic field;
   a magnetic core including a magnetic material; and
   a distance adjusting member to accept adjustment of a distance between at least one loop portion of loop portions and the magnetic core, the loop portions being wiring portions of the respective first and second conductor wiring lines,
   wherein the distance adjusting member accepts movement of the magnetic core in a horizontal direction of the first conductor layer or a horizontal direction of the second conductor layer.

2. The noise filter according to claim 1, wherein the loop portion of the first conductor wiring line and the loop portion of the second conductor wiring line spiral in a same direction.

3. The noise filter according to claim 2, wherein the loop portion of the first conductor wiring line and the loop portion of the second conductor wiring line are coaxially arranged.

4. The noise filter according to claim 1, wherein the magnetic core is adjusted by the distance adjusting member to a location at which a part or all of the magnetic core is disposed inside the at least one of the loop portions of the conductor wiring lines when the board is viewed in a direction orthogonal to each of the first conductor layer and the second conductor layer.

5. The noise filter according to claim 1, wherein the magnetic core and the distance adjusting member have respective threads that mesh with each other.

6. Electrical and electronic equipment comprising:
   a first circuit mounted on a first conductor layer of a board;
   a second circuit mounted on the first conductor layer; and
   a noise filter to suppress propagation of electromagnetic noise between the first circuit and the second circuit, wherein
   the noise filter includes:
   a ground line connected between the first circuit and the second circuit;
   a capacitor having a first end connected to the ground line;
   a first conductor wiring line connected between a second end of the capacitor and the second circuit and wired in a loop shape on the first conductor layer;
   a second conductor wiring line connected between the first circuit and the second end of the capacitor and wired in a loop shape on a second conductor layer of the board, the second conductor wiring line being coupled to the first conductor wiring line by a magnetic field;
   a magnetic core including a magnetic material; and
   a distance adjusting member to accept adjustment of a distance between at least one loop portion of loop portions and the magnetic core, the loop portions being wiring portions the respective first and the second conductor wiring lines.

* * * * *